United States Patent [19]

Wedeen

[11] Patent Number: 4,901,019
[45] Date of Patent: Feb. 13, 1990

[54] THREE-DIMENSIONAL IMAGING

[75] Inventor: Van J. Wedeen, Somerville, Mass.

[73] Assignee: The General Hospital Corporation, Boston, Mass.

[21] Appl. No.: 897,527

[22] Filed: Aug. 18, 1986

[51] Int. Cl.$^4$ ............................................. G01R 33/20
[52] U.S. Cl. .................................... 324/309; 128/653; 324/312; 382/54
[58] Field of Search ........................ 324/306, 309, 312; 128/653; 378/4, 19, 901; 382/54; 364/414; 358/138; 375/122

[56] References Cited

U.S. PATENT DOCUMENTS

| | | | |
|---|---|---|---|
| 3,968,424 | 7/1976 | Ernst | 324/310 |
| 4,389,668 | 6/1983 | Favreau | 358/83 |
| 4,413,233 | 11/1983 | Fossel et al. | 324/309 |
| 4,431,968 | 2/1984 | Edelstein | 324/307 |
| 4,516,075 | 5/1985 | Moran | 324/309 |
| 4,523,596 | 6/1985 | Macovski | 128/653 |
| 4,528,985 | 7/1985 | Macovski | 128/653 |
| 4,532,473 | 7/1985 | Wehrli | 324/306 |
| 4,551,680 | 11/1985 | Macovski | 324/309 |
| 4,556,848 | 12/1985 | Eberhard | 324/309 |
| 4,565,968 | 1/1986 | Macovski | 324/309 |
| 4,593,247 | 6/1986 | Glover | 324/309 |
| 4,644,280 | 2/1987 | Paltiel | 324/309 |

OTHER PUBLICATIONS

Halbach, R. E. et al., "Blood Flow Imaging Techniques Using NMR", IEEE 1982 Frontiers of Engineering in Health Care, Philadelphia, Pa., Sep. 20-21, 1982.

Stark et al., "An Investigation of Computerized Tomography ... Optimum Interpolation," IEEE Transactions on Biomedical Engineering, vol. BME 28, No. 5, May 1981, pp. 496-505.

Stark et al., "Direct Fourier Reconstruction in Computer Tomography," IEEE Transactions on Acoustics Speech and Signal Processing, vol. ASSP-29, No. Feb. 1981, pp. 237-245.

Stark et al., "Image Reconstruction in Computer Aided Tomography by Direct Fourier Methods," IEEE 1980 Frontiers of Engineering in Health Care, Sep. 28-30, 1980, Washington, D.C., pp. 277-280.

Inouye, "Analysis of Artifact Pattern Generation in Two-Dimensional ... Computerized Tomography", Noise and Clutter Rejection in Radar and Imaging Sensors, Oct. 22-24, 1984, pp. 170-175.

Moran et al., "Verification and Evaluation of Internal Flow and Motion," Radiology, vol. 154, No. 2, Feb. 1985, pp. 433-441.

Brooks et al., "Theory of Image Reconstruction in Computed Tomography", Radiology 117:3, Dec. 1975, p. 561.

Wedeen et al., "MR Velocity Imaging by Phase Display," Journal of Computer Assisted Tomography, vol. 9, No. 3, May/Jun. 1985, pp. 530-536.

Waluch et al., "NMR Even Echo Rephasing in Slow Laminar Flow," Journal of Computer Assisted Tomography, vol. 8, No. 4, Aug. 1984, pp. 594-598.

Van Dijk, "Direct Cardiac NMR Imaging of Heart Wall and Blood Flow Velocity," Journal of Computer Assisted Tomography, vol. 8, No. 3, Jun. 1984, pp. 429-436.

Stark et al., "Experimental Investigation of Computerized Tomography by Direct Fourier Inversion," IEEE 1981 Frontiers of Engineering in Health Care, Sep. 19-21, 1981, pp. 89-92.

Moran, "A Flow Velocity Zeugmatography Interlace for NMR Imaging in Humans," Magnetic Resonance Imaging, vol. 1, 1982, pp. 197-203.

(List continued on next page.)

Primary Examiner—Tom Noland
Assistant Examiner—Kevin D. O'Shea
Attorney, Agent, or Firm—Fish & Richardson

[57] ABSTRACT

Images of, e.g., a vascular tree, are obtained in a shorter-than-usual time by deliberately undersampling the object, which results in aliasing, and then processing the undersampled data to eliminate the effects of the aliasing.

21 Claims, 7 Drawing Sheets

OTHER PUBLICATIONS

Mills et al., "Nuclear Magnetic Resonance: Principles of Blood Flow Imaging," *American Journal of Neuroradiology*, vol. 4, Nov./Dec. 1983, pp. 1161–1166.

Valk et al., "MR Imaging of the Aorta with Three-Dimensional Vessel . . . Angiograph", *Radiology*, Dec. 1985, p. 721.

Wedeen et al., "Projective MRI Angiography and Quantitative . . . Densitometry", *Magnetic Resonance in Medicine*, 3, p. 226, (1986).

Leung et al., "Effectiveness of Interpolation . . . Moving Objects", IEEE 1981 Frontiers of Engineering in Health Care, Sep. 19–21, 1981, pp. 93–96.

Hale et al, "MR Imaging of Blood Vessels Using Three-Dimensional Reconstruction Methodology", *Radiology*, Dec. 1984, p. 727.

Hale et al., "The Display of Vascular Structures in MRI" Abstract, Proceedings of SMRM Third Annual Meeting at Berkeley, Calif., Aug. 1984.

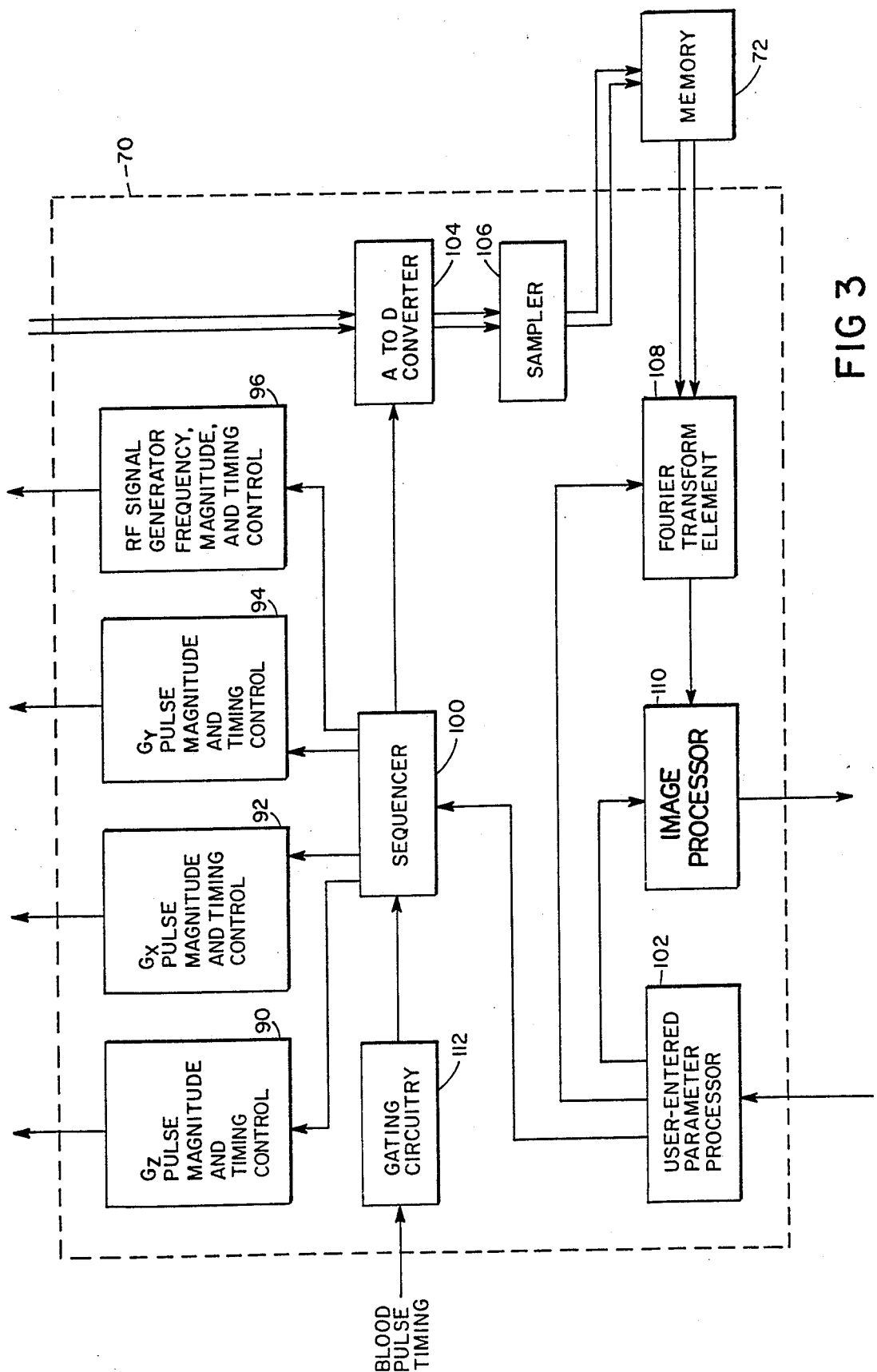

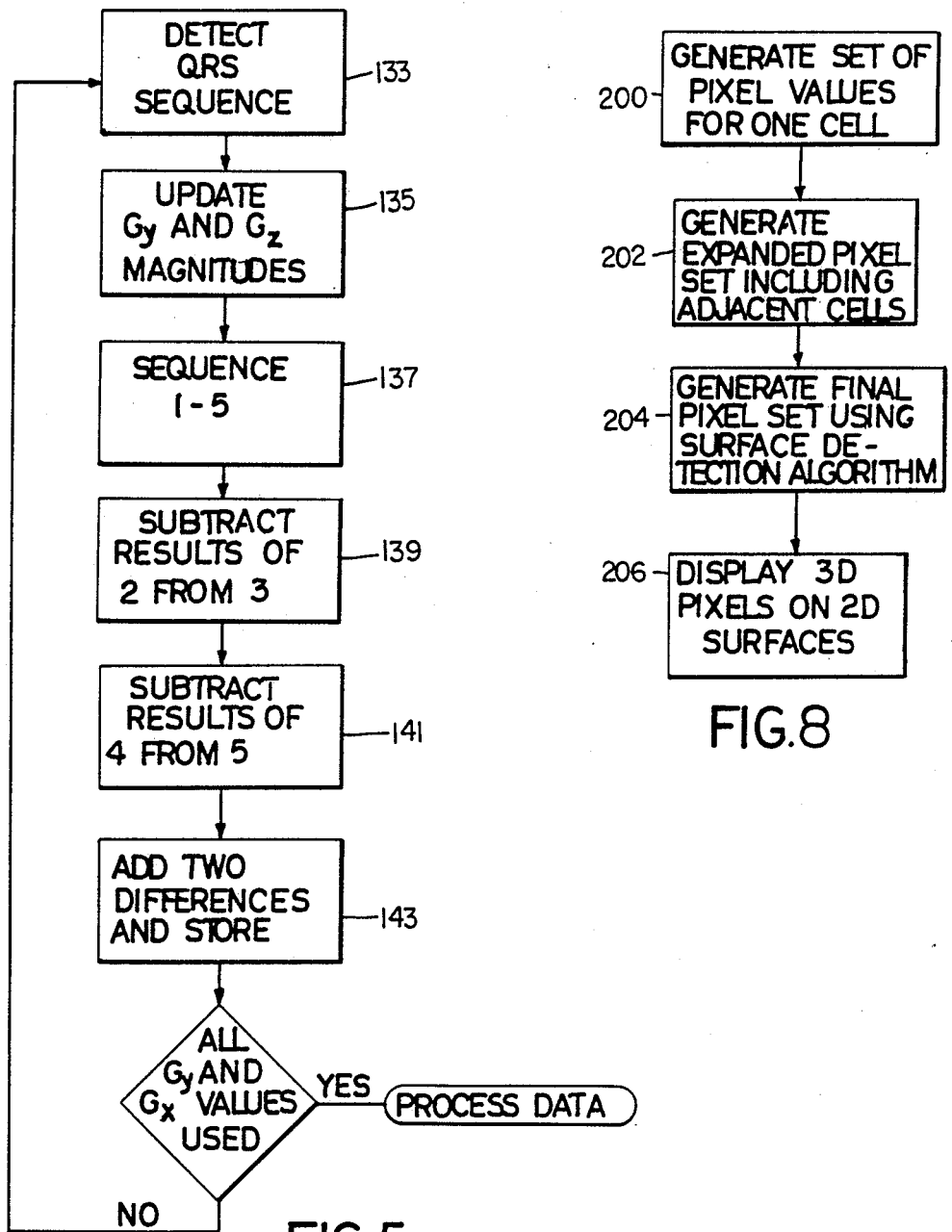
FIG. 5
FIG. 8
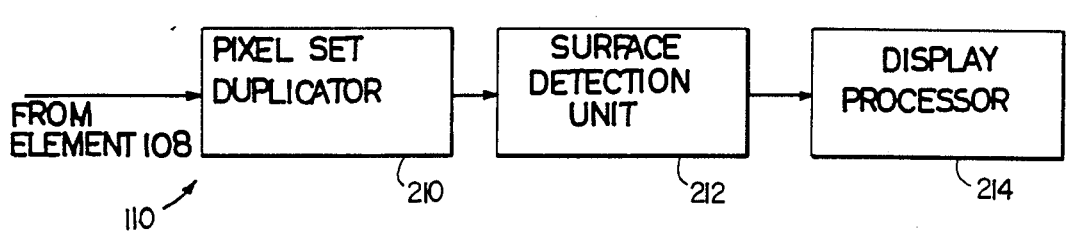
FIG. 9

THREE-DIMENSIONAL IMAGING

BACKGROUND OF THE INVENTION

This invention relates to obtaining, noninvasively, image information about an object, e.g., three-dimensional information about a vascular tree within a living body.

In classic X-ray imaging, X-rays projected through the body expose a film to form a two-dimensional image.

More recent computerized X-ray tomography techniques provide two-dimensional images (tomograms) of cross-sectional slices through the body. Nuclear magnetic resonance (NMR) has also been used to create tomograms.

One way to obtain three-dimensional information is to acquire data for a succession of tomograms associated with a stack of cross-sectional slices.

Typically, in NMR, the amount of time required to acquire the image information generally depends on the number of picture elements (pixels) desired in the final image. For three-dimensional information, the total time is typically a large multiple of the time for a single two-dimensional tomogram.

Two-dimensional NMR images (both tomographic and projective) of a vascular tree can be enhanced by taking advantage of the contrast between the motion of the blood within the vessels and the general lack of motion of the surrounding tissue.

It has been proposed to obtain three-dimensional information about a vascular tree by acquiring a succession of two-dimensional NMR tomograms and interpolating between them to obtain the three-dimensional information. Typically the resolution within the plane of each tomogram is one mm, while the resolution from tomogram to tomogram is only five to ten mm.

SUMMARY OF THE INVENTION

The invention shortens the time for acquiring the original data needed to generate the image information.

A general feature of the invention is in generating information representative of an image of an object by first acquiring from the object data that are subject to aliasing, and then processing the acquired data to generate the information representative of the image, free of the effects of the aliasing.

Preferred embodiments include the following features. The object has predetermined extents in two dimensions, and the data are acquired using fields of view in those two dimensions that are smaller than the extents of the object in the two dimensions. The object has spatial continuity, and the acquired data is processed based on the continuity. The data acquisition is arranged so that the acquired data can exhibit equally good resolution along all of the dimensions of the object. The object is a flowing fluid (e.g., blood) contained within a relatively static vessel (e.g., a vascular tree), and the image represented by the information is enhanced based on the flow. In some embodiments, the aliasing causes no intersections between different portions of the object appearing in an intermediate data image that is generated from the acquired data prior to processing. The data are acquired using nuclear magnetic resonance apparatus to apply phase encoding gradient pulses along at least one dimension of the object. The flowing fluid is characterized by pulsatility and the data acquisition technique is responsive to the pulsatility. Fourier transform analysis is used. In some embodiments, the image is three-dimensional. In some embodiments, information (phase difference) is imparted to the acquired data to differentiate different portions of that object that intersect in the intermediate data image, and one of the intersecting portions is excluded based on the phase difference information.

The technique permits rapid data acquisition. The acquired data can be used to produce three-dimensional images with equally good resolution in all dimensions, or more conventional two-dimensional tomographic or projection images. The technique is especially useful wherever the structure of interest is continuous and sparse, and the acquired data exhibits high contrast between a structure of interest and the matrix in which it lies.

Other advantages and features will become apparent from the following description of the preferred embodiment, and from the claims.

DESCRIPTION OF THE PREFERRED EMBODIMENT

We first briefly describe the drawings.

FIG. 3 is a block diagram of the processor of FIG. 2.

FIG. 5 is a flowchart of data acquisition steps.

Figure 6A:
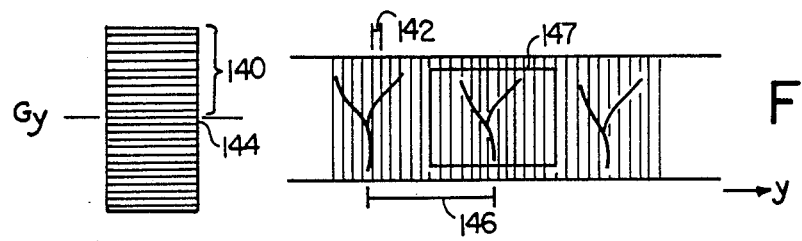
Figure 6B:
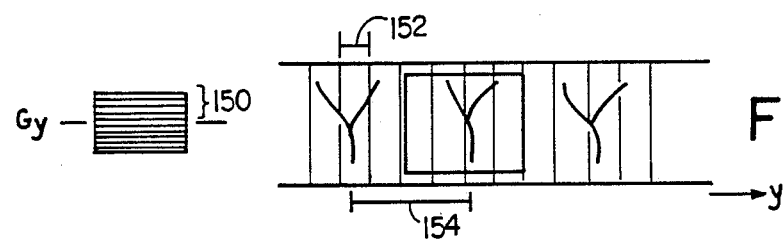
Figure 6C:
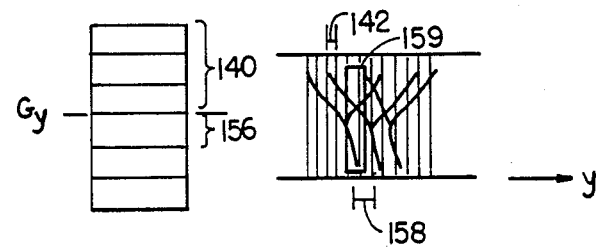

FIGS. 6A, 6B, 6C respectively show three gradient pulse schemes and corresponding images.

Figure 7:
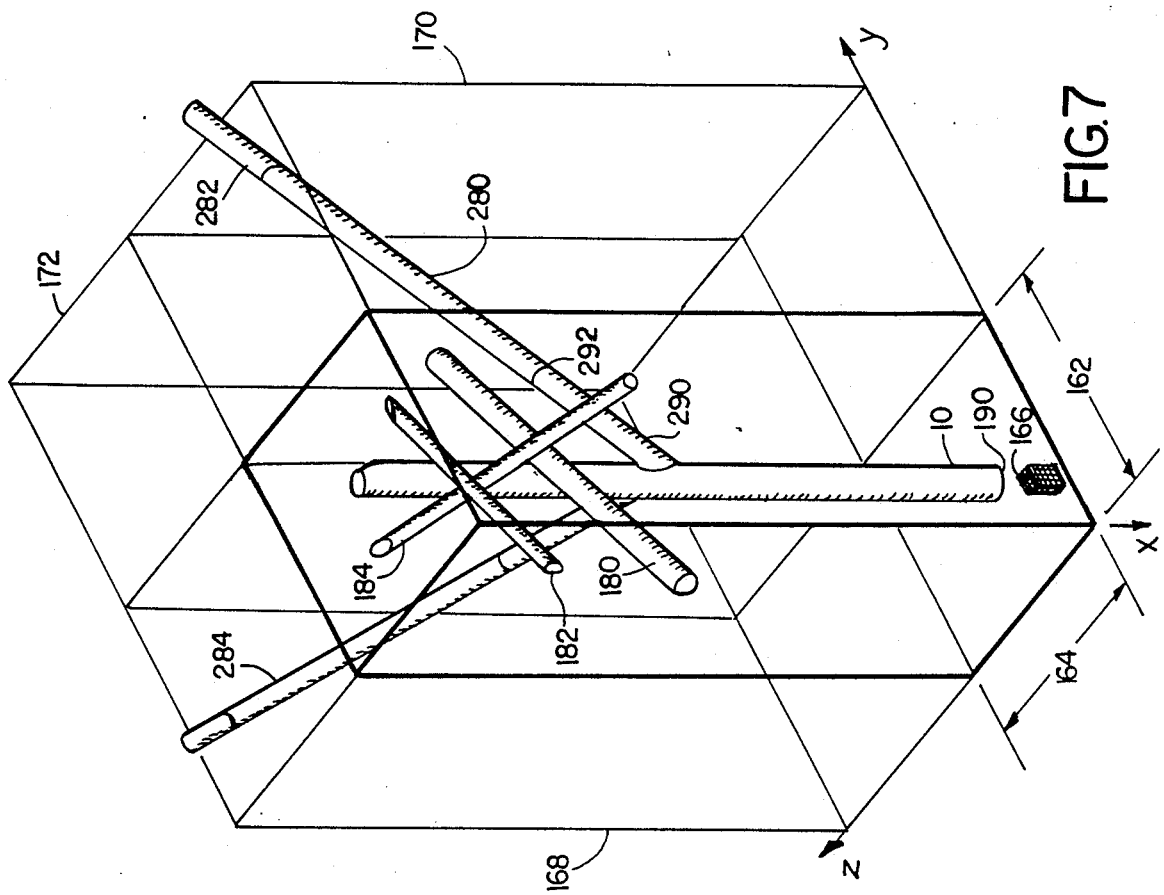
Figure 1:
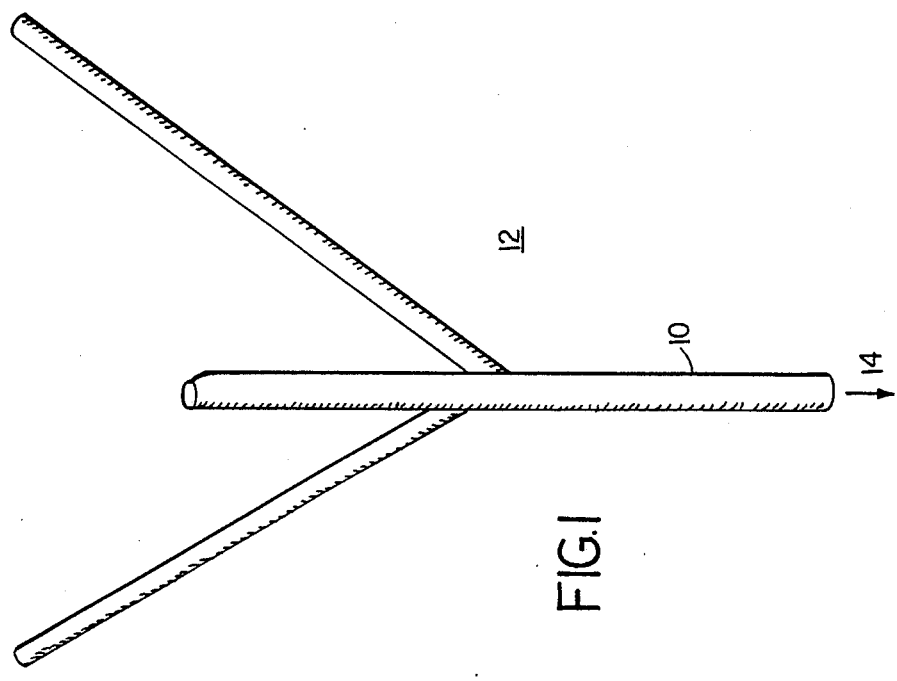
FIG. 1 is an isometric view of a vascular tree.

FIG. 7 is an isometric view like FIG. 1 but showing the effects of aliasing.

FIG. 8 is a flow chart of data processing steps.

FIG. 9 is a block diagram of the display Processor of

Figure 10:
Figure 11:
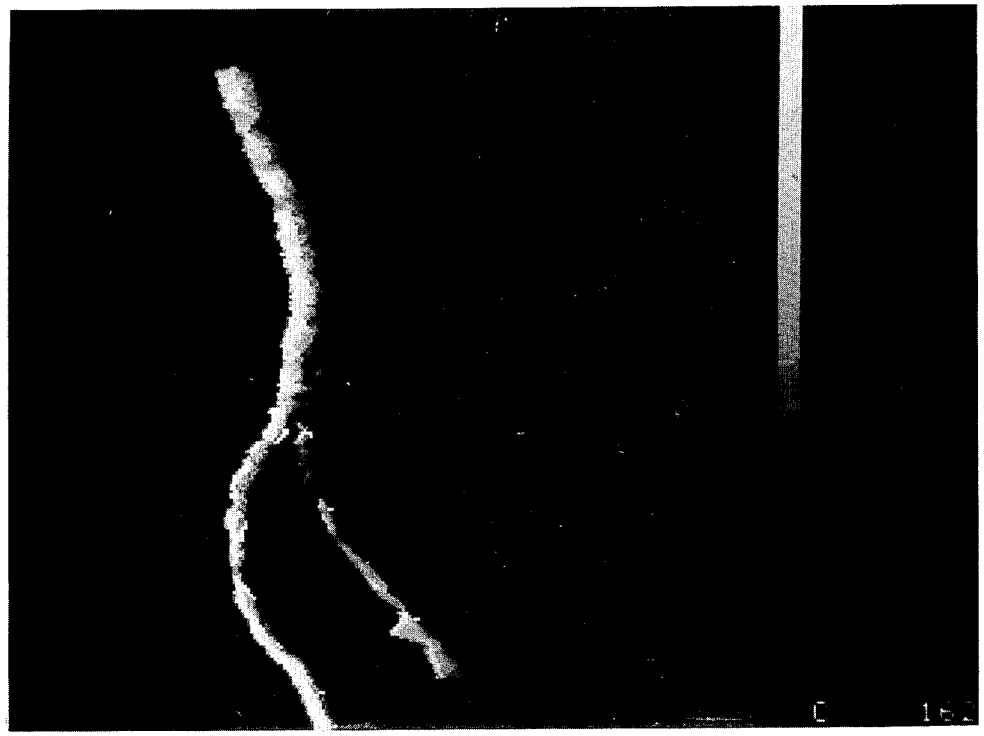

FIGS. 10, 11 are two views of an abdominal aortic bifurcation.

Figure 12:
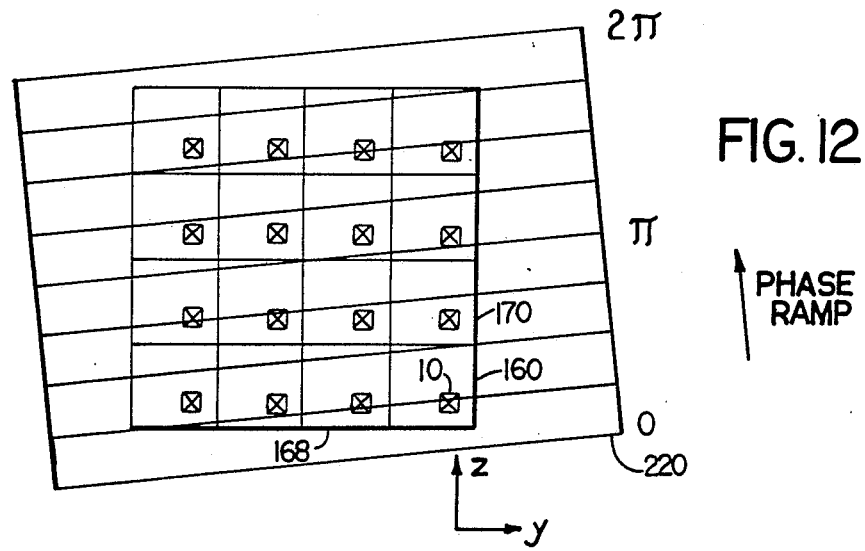

FIG. 12, is a top view of the y-z plane showing a phase

Figure 13:
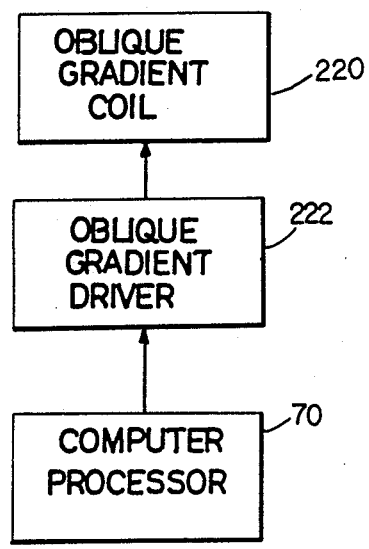

FIG. 13 is a block diagram of oblique gradient generating apparatus.

STRUCTURE AND OPERATION

Referring to FIG. 1, a vascular tree 10 (from which three-dimensional information is to be acquired) lies within a matrix of tissue 12, and carries blood flowing in the direction of arrow 14.

Figure 2:
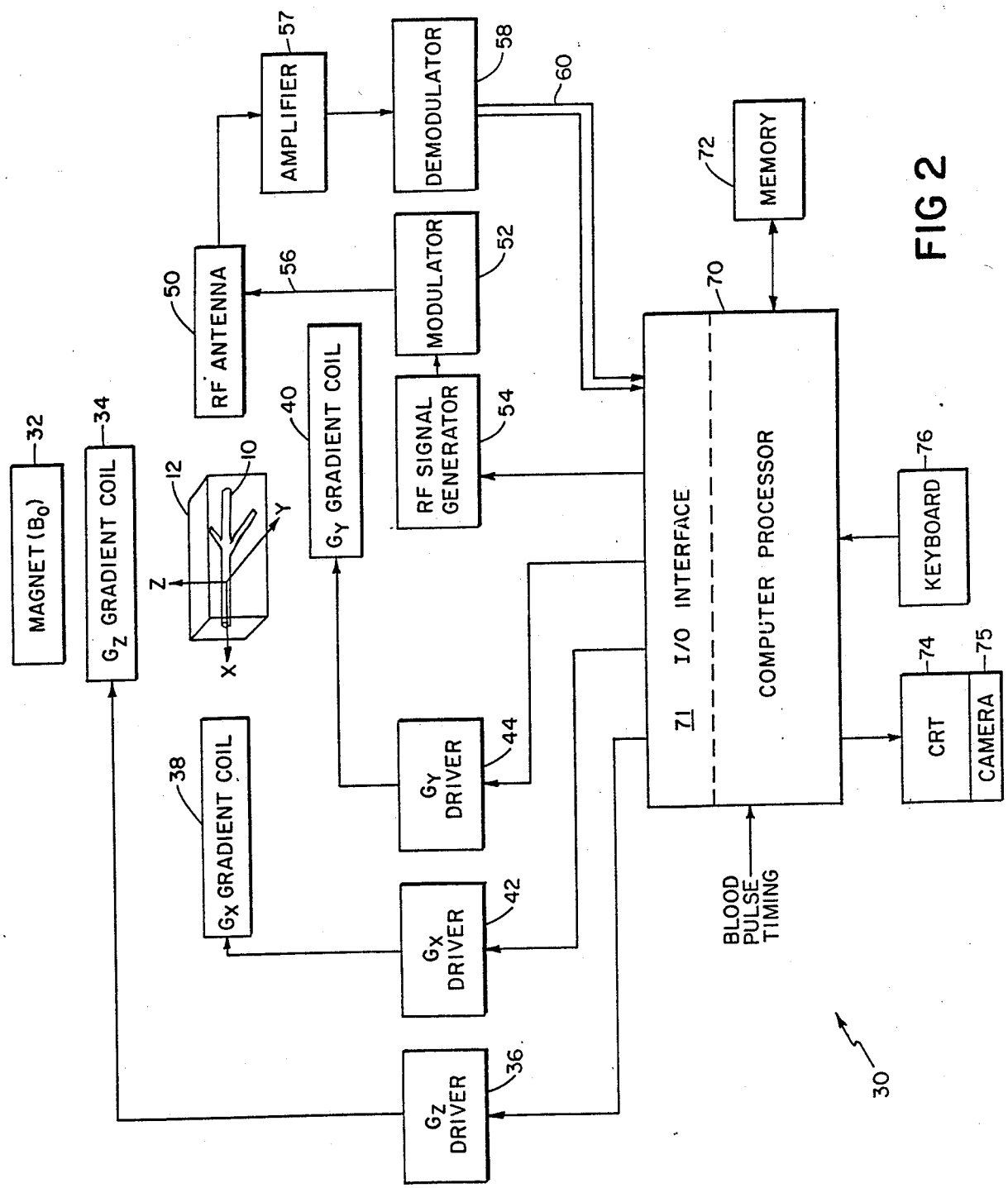
FIG. 2 is a block diagram of NMR apparatus.

Referring to FIG. 2, a nuclear magnetic resonance apparatus 30 (1 meter bore, available from Technicare, Solon, Ohio) has a magnet 32 (0.6 T superconducting) for imposing a uniform constant magnetic field $B_0$ on vascular tree 10 and tissue 12. A $G_z$ gradient coil 34 (arranged to provide a linear magnetic field gradient along the z-axis) is connected to a $G_z$ driver 36, which can provide selected levels of power at selected times to coil 34. Likewise, $G_x$ gradient coil 38 and $G_y$ gradient coil 40 (which can provide linear magnetic field gradients respectively along the x-axis and y-axis) are respectively connected to $G_x$ driver 42 and $G_y$ driver 44, for providing power to the coils.

An RF antenna 50 (arranged to transmit and receive an RF signal to and from vascular tree 10 and tissue 12) is connected to modulator 52 which is in turn connected to an RF signal generator 54 and is arranged to impose an RF signal at a selected frequency and at selected times upon vascular tree 10 and tissue 12. RF antenna 50 is also connected via amplifier 57 to demodulator 58, which is arranged to demodulate received signals (from vascular tree 10 and tissue 12) into quadrature real and imaginary components (indicated by the doubling of line 60).

Computer processor 70 is connected via I/O interface 71 to $G_x$, $G_y$, and $G_z$ drivers 42, 44, 36, to control the magnitude and timing of the linear gradient pulses imposed along the three axes upon vascular tree 10 and tissue 12, and to signal generator 54 to control the frequency, magnitude, and timing of the RF pulses.

Processor 70 is also connected via I/O interface 71 to demodulator 58 to receive the real and imaginary components of the demodulated received RF signal.

Processor 70 is further connected to a memory 72 (which stores software to control the operation of the system and data representing the received RF signal components), to a CRT 74 (which displays images representing the received RF signals, as well as information needed by the operator to control the system), and to a keyboard 76 (by which the operator can enter data and information to control the entire operation of the system). A camera 75 attached to CRT 74 takes photographs of the displayed images.

Referring to FIG. 3, processor 70 includes $G_z$ pulse magnitude and timing control 90 which is connected to trigger $G_z$ driver 36 to apply selected levels of gradient at selected times. Likewise $G_x$ and $G_y$ pulse magnitude and timing controls 92, 94 are connected to trigger respectively $G_x$ and $G_y$ drivers 42, 44.

Similarly RF signal generator frequency, magnitude, and timing control 96 is connected to trigger RF signal generator 54 to provide an RF pulse having a selected frequency and magnitude, at selected times.

Controls 90, 92, 94, 96 are all connected to a sequencer 100 which provides the necessary specific magnitude, timing, and frequency parameters at the proper times for a given NMR pulse sequence.

Sequencer 100 is connected to a user-entered parameter processor 102 which receives parameters from the keyboard and converts them to a form usable by sequencer 100.

Sequencer 100 is also connected to control an A-to-D converter 104 which is in turn connected to demodulator 58 to digitize the real and imaginary components of the received RF signal. A sampler 106 is connected to the converter 104 to sample the digitized signal components and to memory 72 to store the samples for later processing.

A Fourier transform element 108 is connected to memory 72 for performing a complex three-dimensional Fourier transform on a family of received signal samples to produce real and imaginary components of a three-dimensional array of data in the frequency domain. The parameters in accordance with which the Fourier transform is performed are received from processor 102 based on user entered information.

An image processor 110 is connected to Fourier transform element 108 to organize and process the frequency domain data into three-dimensional image information representative of vascular tree 10 for delivery to CRT 74, again in accordance with parameters received from processor 102 as provided by the user.

Sequencer 100 is also connected to gating circuitry 112 which provides signals enabling the sequencer to synchronize successive pulse sequences to occur at the same point in successive heartbeats.

The invention can be implemented by appropriately connecting and configuring available hardware and by specifying operating parameters for available related software, in accordance with the foregoing and following description (for example, NMR imaging hardware and software available from Technicare Corporation, Solon, Ohio, or similar systems available from other vendors).

Figure 4A:
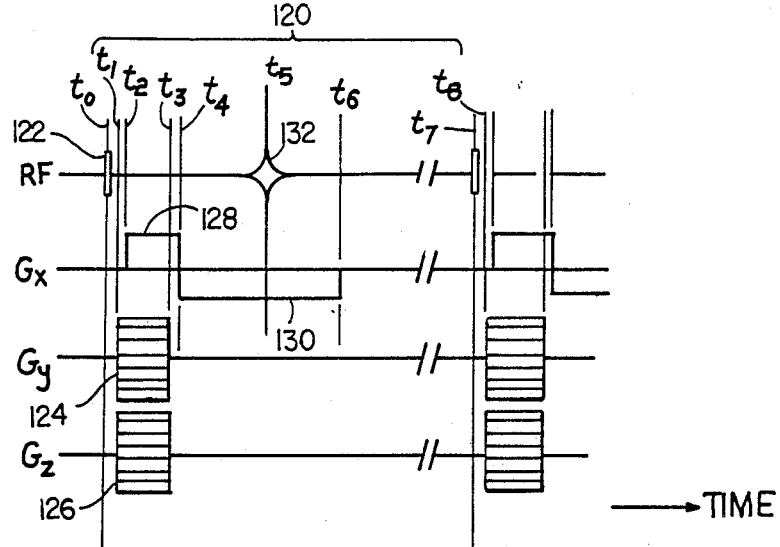
FIG. 4A is a pulse sequence diagram.

Referring to FIG. 4A, vascular tree 10 and tissue 12 are subjected to a series of pulse sequences, e.g., sequence 120.

An RF excitation pulse 122 begins the pulse sequence at time $t_0$. Pulse 122 imparts a tip angle less than 90° (e.g., 30°) and obeys the relationship ($\cos \theta = \exp(-T_R/T_{1(blood)})$), giving $\theta = 30°$) discussed in Ernst, "Sensitivity Enhancement in Magnetic Resonance", 2:1-135, 1966. At time $t_5$ (e.g., 15.4 milliseconds after $t_0$), the echo signal appears. RF pulse 122 is repeated ($T_R$=the repetition period) at time $t_7$ (e.g., 175 milliseconds after $t_0$) to begin another pulse sequence.

Beginning at time $t_1$ (almost immediately after $t_0$) and ending at time $t_3$, phase encoding gradient pulses $G_y$ 124 and $G_z$ 126 are applied respectively along the y and z coordinates. For each pulse sequence 120, $G_y$ is set at one of 32 different values, and $G_z$ is likewise set at one of 32 values.

Beginning at $t_2$ (almost immediately after $t_1$) and ending at $t_4$, a $G_x$ refocusing gradient pulse 128 is applied, followed immediately by a negative $G_x$ read gradient Pulse 130 ending at $t_6$. Pulse 130 spans the period during which the RF echo signal 132 (centered at $t_5$) appears.

Figure 4B:
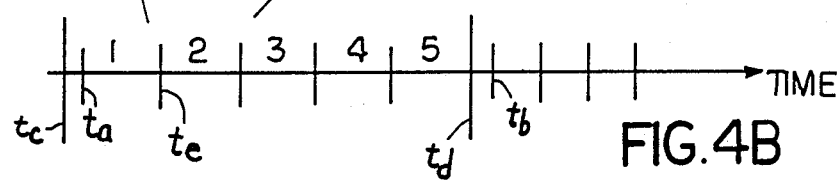
FIG. 4B is a time line showing successive pulse sequences.

Referring to FIG. 4B, five successive pulse sequences 120 are performed in a time period between $t_a$ and $t_b$ which has the same duration as the period ($t_c$ to $t_d$) between successive QRS sequences (heartbeats). Gating circuitry 112 (FIG. 3) detects the occurence at time $t_c$ of each QRS sequence and sequencer 100 triggers the next series of pulse sequences at time $t_a$.

For each pulse sequence 120, 256 samples are taken of the echo signal 132, at a rate of 20 kHz, corresponding to 256 pixels along the x axis in the final image.

Referring to FIG. 5, after the QRS sequence is detected 133, the values of the $G_y$ and $G_z$ pulses are updated 135, and beginning at time $t_a$ a series of identical pulse sequences 1–5 is applied 137. The samples measured in sequences 2 and 3 are subtracted as complex numbers 139, as are the samples measured in sequences 4 and 5, in step 141. The results of the two subtraction operations are then added 143 for averaging purposes resulting in 256 data points. Until all $32 \times 32 = 1024$ combinations of $G_y$ and $G_z$ values have been used, the procedure repeats.

The result of the pulse sequences is a set of original three-dimensional data comprising real and imaginary components of $1024 \times 256 = 262,144$ data points, all acquired in a period of 1024 heart beats.

The subtractions of data 139, 141 enhance the contrast between information about the flowing blood relative to information about the surrounding static tissue. This occurs because changes in blood flow velocity from one heartbeat gating offset to another (represented by the different intervals between $t_c$ and the beginning of each pulse sequence 1–5) cause a difference in magnitudes and phases of the two original data values.

Note that the pulse sequence 1 after each QRS sequence has a $T_R$ (the period from $t_c$ to $t_d$ in FIG. 4B) different from the other pulse sequences for that heartbeat, and also therefore a different $T_1$ contrast. Thus the pulse sequence 1 data is excluded from the subtraction process.

The number of different gradient pulses $G_x$ and $G_y$, the magnitudes of the smallest and largest gradient pulses, and the magnitudes of the step sizes between pulses are chosen such that the image information available from vascular tree 10 and tissue 12 is deliberately undersampled in both y and z directions, in the following sense.

Referring to FIGS. 6A, 6B, 6C, consider an NMR Fourier transform imaging experiment in only two dimensions with the phase encoding gradient pulses applied in the y-axis only. Such an experiment is characterized by a resolution (i.e., spacing of the image pixels) and a field of view (defined below) that are governed by the numbers of different magnitude pulses, and the maximum and minimum magnitudes of the $G_y$ gradient pulses.

In particular, the resolution (in pixels/cm) is proportional to the magnitude of the largest pulse; and the field of view (in cm) is inversely proportional to the magnitude of the smallest pulse (which is typically also the step size).

Referring to FIG. 6A, for example, a large maximum $G_y$ pulse 140 corresponds to a pixel width 142, while a small minimum pulse 144 corresponds to a large field of view 146.

The original data set generated by applying the sequence of $G_y$ pulses shown in FIG. 6A, would, if converted by conventional Fourier transform techniques to pixel values, generate an image 147. The original data set can be thought of as representing a sequence of copies of image 147, arrayed along the y axis at regular intervals. The field of view is defined as the interval between adjacent copies.

If the field of view is larger than the y-axis extent of each image copy, each image copy looks like the object being imaged, and adjacent copies do not overlap.

Referring to FIG. 6B, if the maximum pulse 150 is reduced, while retaining the same minimum pulse and step size, the resolution decreases (i.e., pixel width 152 increases), but the field of view 154 remains unchanged. In this way, the number of different steps (and time) needed to acquire the original data set may be reduced, but only at a cost of lower resolution.

Referring to FIG. 6C, returning to the original maximum pulse 140, but increasing the minimum pulse 156, results in the original pixel size 142 but reduces the field of view 158. It also reduces the steps (and time) required for acquiring the original data set (relative to FIG. 6A), but causes an overlapping of the successive image copies (also called wrap-around or aliasing). The object is then said to have been undersampled. Because the field of view is now narrower than the width of the object, when the original data set is converted to an image 159, although all parts of the object will appear somewhere in each image copy, the image copy does not appear like the object being imaged; rather the parts will be disconnected from one another, and the image copy (called an aliased image copy) will be narrower in both y and z directions than the original object.

In the invention, the time for acquiring the original data set is reduced by deliberately undersampling; and the effects of the resulting aliasing are eliminated in later processing to produce a fully connected full width image of the original object.

Referring to FIG. 7, a similar situation to that of FIG. 6C exists for three-dimensional imaging when the object is deliberately undersampled. The original data set can be viewed as representing a number of three-dimensional copies of an aliased image of the vascular tree 10, the copies being arrayed at regular intervals on a two-dimensional grid in the y-z plane. Each aliased image copy appears within a rectilinear cell 160 whose y-axis dimension 162 is the y-axis field of view, and whose z-axis dimension 164 is the z-axis field of view. (In FIG. 7, the image copies are not shown; only the representative adjoining cells 168, 170, 172, 174 in which they would appear are shown.) Pixel grid 166 has y and z pixel dimensions determined by the maximum $G_y$ and $G_z$ pulses, respectively.

As in the two-dimensional case of FIG. 6C, all of the parts of the vascular tree are included in each aliased image copy but they are disconnected (wrapped around) and the aliased image narrower than the original object.

Thus, in FIG. 7, aliasing is represented by the fact that vascular segments 180, 182, 184 (which correspond to parts 280, 282, 284 of the original vascular tree 10) appear within cell 160, but they are disconnected from their proper locations. Thus all of the information needed to generate a complete full-width connected image of the vascular tree (without the aliased disconnected parts) is available in the original data set.

Note that none of the segments 180, 182, 184 intersects with another segment or with any other part of the image of the vascular tree. This is true because the vascular tree has a very sparse structure in which the vessels occupy relatively very little of the space spanned by the tree. The likelihood of there being no intersection is enhanced if the orientation of the y and z coordinates are carefully set obliquely to the plane in which the main vessels of the vascular tree lie.

As a result, it is possible to reduce the field of view (and hence the time for data acquisition) by a large factor (e.g., 16:1 or 64:1) without causing any intersection among the parts of the aliased image copy within cell 160.

To recover complete full width fully connected image from the original data set described above, the following steps are used.

Referring to FIG. 8, first, the original data set is processed by conventional three-dimensional Fourier analysis, to generate 200 an original set of pixel values corresponding to the aliased image copy in cell 160 (FIG. 7). Next the original set of pixel values is expanded 202 by duplicating all pixel values to generate image copies corresponding to the adjoining cells along both dimensions. The number of copies generated in each dimension is chosen large enough so that the copies span the full dimensions of the original vascular tree.

The duplication process results in an expanded pixel set that includes one fully connected, full width image of the vascular tree together with disconnected segments. For example, in FIG. 7, part 280 of the duplicate image in cell 170 is a translated version of segment 180 which is now properly connected to arm 290 at point 292 where arm 290 reaches the boundary of cell 160.

Because the vascular tree has the property of being continuous and uninterrupted, in addition to being sparse, a conventional surface detection algorithm can be applied 204 to the expanded pixel set to derive a final set of pixel values that shows only the surface of one fully connected, full width copy of the vascular tree exclusive of disconnected parts produced by aliasing.

In one such algorithm, the first step is to screen out all pixels whose values do not exceed a minimum threshold, thus filtering out pixels representing image noise. The user then directs the algorithm to a starting pixel within the filtered expanded pixel set whose location is known to be on the surface of the vascular tree, e.g., a pixel at location 190 (FIG. 7).

The algorithm then searches the six pixels that are adjacent to the starting pixel and includes within a final pixel set all adjacent pixels that are within the filtered set. For each of those included pixels the same analysis and selection is done for all adjacent pixels and so on until the entire image has been canvassed. Note that when the algorithm reaches a boundary of the original cell 160, it simply proceeds into the adjacent cell. Any pixels on disconnected segments are excluded from the final pixel set.

In some cases, e.g., if there is a discontinuity in a vessel (for example caused by stenosis), the operator may have to run the surface detection algorithm again beginning at a point on the other end of the discontinuity from the portion of the tree already processed.

Using the final pixel set, a variety of available display algorithms may be used 206 to generate a display image of the vascular tree. In general, such algorithms use a visual cue (such as shading) to provide a three-dimensional impression on a two-dimensional surface, e.g., a CRT screen.

Referring to FIG. 9, image processor 110 (FIG. 3) for these purposes thus includes a pixel set duplicator 210 that generates the expanded pixel set and feeds it to a surface detection unit 212 that in turn feeds the final pixel set to a display processor 214 (for generating the final display).

FIGS. 10, 11 show two views (rotated relative to one another) of the abdominal aortic bifurcation in a normal subject using the undersampling and image processing technique of the invention. A gray scale calibration shape is included with each image. The original data was acquired by undersampling with a factor of 4:1 in each of the y and z dimensions for a composite aliasing factor of 16:1. The spatial resolution is 1.6 mm (in x) by 3.2 mm (in y and z). The field of view was 40 cm (in x) by 10 cm (in y and z).

Other embodiments are within the following claims.

For example, even when the object being imaged is such that the aliasing causes actual intersection of parts of the aliased image (i.e., two pixel values of two different parts of the object fall on the same aliased image pixel), the surface detection algorithm can still be made to disregard the pixels that are not to be part of the final fully connected image by the following technique.

The original data set is given a spatially continuous phase (supplementing the existing velocity-based phase variations) which never has the same value for any two pixel values that map onto the same aliased image pixel. Almost all linear phase ramps have such a property, though not all with an equal phase contrast.

Referring to FIG. 12, the phase ramp 220 could be produced by a brief gradient pulse at an oblique angle in the y-z plane. Then true continuities at pixels where there is an intersection can be distinguished from spurious continuity based on phase continuity, for the phase at each pixel is determined by its location in real three-dimensional space, not by its position in the aliased image.

Referring to FIG. 13, the phase ramp may be imparted by an oblique gradient coil 220 driven by an oblique gradient driver 222 which is connected (as are the $G_x$, $G_y$, and $G_z$ drivers) to processor 70. The surface detection program would be modified to accept the original data as complex numbers. If the phase contrast in a single study is inadequate, it can be repeated with a second phase ramp, and the two compared. In theory, the phase ramp in a single image would sort out all two-branch collisions; higher order collisions (three or more branch collisions) would need additional data acquisitions to be resolved. Thus there is a tradeoff between a small field of view and use of several phase ramps and a larger field of view and fewer phase ramps.

Often, the experiment will inherently produce a complicated, non-linear, continuously changing (with position) background phase variation having the desired properties, obviating the need for the apparatus of FIG. 13.

Also in other embodiments, the imaging medium could be other than NMR, e.g., ultrasonics, or any other imaging medium in which the time required for data acquisition depends on the field of view, and in which reducing the field of view to a size smaller than the object causes aliasing.

Other features besides flow effects can be used to establish high contrast between the object and the surrounding matrix.

Flow contrast can be achieved by any technique that suppresses signal associated with static tissue relative to signal associated with flowing blood.

The acquired three-dimensional original data set, after the processing to eliminate aliasing, could be used for other purposes including generation of two-dimensional projection images.

The information carried in the original data set (and thus shown in the final image) could be richer than simply surface information, including, for example, profiles of blood flow velocity throughout the vessel lumen and profiles of the vascular tree over time.

More than five pulse sequences could be performed in each heartbeat period. Time domain information can be derived from the successive pulse sequences and displayed either as a single image (e.g., a color image in which different colors represent different moments in time) or as a cartooned sequence.

Two-dimensional aliased images (e.g., FIG. 6C), with or without actual overlap, could also be processed.

Also in other embodiments, a variety of techniques other than (or in addition to) surface detection can be used to Process the original data set. For example, a user could interact with a display of the expanded pixel set using a light pen to point to portions to be deleted from the final image. That technique could be used even when intersections occur between different portions of the aliased image.

The degree of aliasing can be varied depending on the sparseness and character of the object either to assure no intersections in the aliased image, or any desired degree of intersection.

The object being imaged can be discontinuous provided that rules describing the spatial relationship of the discontinuous parts can be discerned and used to eliminate the effects of aliasing.

The gradient pulses can be selected to provide equal resolution in all three dimensions or any desired relationships among the resolutions in the three dimensions.

I claim:

1. A method of generating information representative of a three-dimensional image of a vascular tree comprising acquiring three-dimensional nuclear magnetic resonances data from said tree using phase encoding gradient pulses along two dimensions, said phase encoding gradient pulses having minimum values corresponding to fields of view, along said dimensions, that are smaller than the respective extents of said tree along said dimensions, thereby producing aliasing in said acquired data, and processing said acquired data to eliminate the effects of said aliasing.

2. Apparatus for generating information representative of an image of an object that has a predetermined extent in at least one dimension, comprising means for acquiring data from said objects, said acquiring means having field of view in said one dimension that is smaller than the extent of said object in said one dimension and being arranged to produce aliasing in said acquired data, and means for processing said acquired data to generate said information representative of said image, free of the effects of said aliasing.

3. The apparatus of claim 2 wherein said object has a predetermined extent in a second said dimension, and said means for acquiring has a field of view in said second dimension that is smaller than the extent of said object in said second dimension.

4. Apparatus for generating information representative of an image of an object that has spatial continuity, comprising means for acquiring data from said object, said acquiring means being arranged to produce aliasing in said acquired data, and means for processing said acquired data by screening said acquired data based on said continuity to generate said information representative of said image, free of the effects of said aliasing.

5. Apparatus for generating information representative of an image of an object comprising means for acquiring data from said object, said acquiring means being arranged to produce aliasing in said acquired data and being arranged so that said acquired data can exhibit equally good resolution along all dimensions of said object, and means for processing said acquired data to generate said information representative of said image, free of the effects of said aliasing.

6. Apparatus for generating information representative of an image of an object that includes a flowing fluid contained within a relatively static vessel, comprising means for acquiring data from said object, said acquiring means being arranged to produce aliasing in said acquired data and to enhance the image represented by said information based on said flow, and means for processing said acquired data to generate said information representative of said image, free of the effects of said aliasing.

7. The apparatus of claim 6 wherein said flowing fluid is characterized by pulsatility and said means for acquiring includes means responsive to said pulsatility.

8. Apparatus for generating information representative of an image of an object, comprising means for acquiring data from said object, said acquiring means being arranged to produce aliasing in said acquired data, said aliasing causing no intersections between different portions of said object in an intermediate data image that is generated from the acquired data prior to processing, and means for processing said acquired data to generate said information representative of said image, free of the effects of said aliasing.

9. Apparatus for generating information representative of an image of an object, comprising nuclear magnetic resonance apparatus for applying phase encoding gradient pulses along a dimension of said object to acquire data from said object, said nuclear magnetic resonance apparatus being arranged to produce aliasing in said acquired data, and means for processing said acquired data to generate said information representative of said image, free of the effects of said aliasing.

10. Apparatus for generating information representative of an image of an object that includes blood flowing in a vascular tree, comprising means for acquiring data from said objects, said acquiring means being arranged to produce aliasing in said acquired data, and means for processing said acquired data to generate said information representative of said image, free of the effects of said aliasing.

11. Apparatus for generating information representative of an image of an object, comprising means for acquiring data from said object, said acquiring means being arranged to produce aliasing in said acquired data, and means for processing said acquired data by Fourier transform analysis to generate said information representative of said image, free of the effects of said aliasing.

12. Apparatus for generating information representative of an image of an object, comprising means for acquiring data from said object representative of a three-dimensional image, said acquiring means being arranged to produce aliasing in said acquired data, and means for processing said acquired data to generate said information representative of said image, free of the effects of said aliasing.

13. Apparatus for generating information representative of an image of an object, comprising means for acquiring data from said object, said acquiring means being arranged to produce aliasing in said acquired data and including means for imparting, in said acquired data, information that differentiates acquired data representing one portion of said object from acquired data representing another portion of said object when said portions would intersect in an intermediate data image generated from said acquired data prior to processing, and means for processing said acquired data to generate said information representative of said image, free of the effects of said aliasing, said processing means excluding one of said intersecting portions based on said information.

14. The apparatus of claim 13 wherein
said means for imparting comprises means for establishing phase differences between said acquired data representing said one portion and said acquired data representing said other portion.

15. A method for generating information representative of an image of an object having a predetermined extent in at least one dimension, comprising
   acquiring data from said object using a field of view in said one dimension that is smaller than the extent of said object in said one dimension to produce aliasing in said data, and
   processing said acquired data to generate said information representative of said image, free from the effects of said aliasing.

16. The method of claim 15 wherein said objects has a predetermined extent in a second said dimension, and said step of acquiring comprises using a field of view in said second dimension that is smaller than the extent of said object in said second dimension.

17. A method for generating information representative of an image of an object having spatial continuity, comprising
   acquiring data from said object in a manner selected to produce aliasing in said data, and
   processing said acquired data by screening said acquired data based on said continuity to generate said information representative of said image, free from the effects of said aliasing.

18. A method for generating information representative of an image of an object that includes a fluid flowing at a variable rate and contained within a relatively static vessel, comprising
   acquiring data from said object in a manner selected to produce aliasing in said data and to enhance said image based on said flow, and
   processing said acquired data to generate said information representative of said image, free from the effects of said aliasing.

19. The method of claim 18 wherein said flowing fluid is characterized by pulsatility and said step of acquiring includes responding to said pulsatility.

20. A method for generating information representative of an image of an object, comprising
   applying nuclear magnetic resonance phase encoding gradient pulses along a dimension of said object to acquire data from said object in a manner selected to produce aliasing in said data, and
   processing said acquired data to generate said information representative of said image, free from the effects of said aliasing.

21. A method for generating information representative of an image of an object, comprising
   acquiring data from said object representative of a three-dimensional image in a manner selected to produce aliasing in said data, and
   processing said acquired data to generate said information representative of said image, free from the effects of said aliasing.

* * * * *

UNITED STATES PATENT AND TRADEMARK OFFICE
CERTIFICATE OF CORRECTION

PATENT NO. : 4,901,019

DATED : February 13, 1990

INVENTOR(S) : Van J. Wedeen

It is certified that error appears in the above-identified patent and that said Letters Patent is hereby corrected as shown below:

Col. 2, line 37, "Processor of" should be --processor of Fig. 3--;

Col. 4, line 30, "Pulse 130" should be --pulse 130--;

Col. 8, line 50, "Process" should be --process--;

Col. 9, claim 1, line 5, "resonances" should be --resonance--;

Col. 10, claim 10, line 22, "objects" should be --object--.

Signed and Sealed this

Twenty-ninth Day of October, 1991

Attest:

HARRY F. MANBECK, JR.

*Attesting Officer*　　　*Commissioner of Patents and Trademarks*